United States Patent [19]
Doherty, Jr.

[11] 3,866,999
[45] Feb. 18, 1975

[54] ELECTRONIC MICROELEMENT ASSEMBLY

[75] Inventor: John Joseph Doherty, Jr., Franklin, Mass.

[73] Assignee: IFE Division of Plastic Mold & Engineering Company, East Providence, R.I.

[22] Filed: Nov. 16, 1973

[21] Appl. No.: 416,420

[52] U.S. Cl... 339/17 CF, 317/101 CP, 339/75 MP, 339/174, 339/217 R

[51] Int. Cl. .......... H05k 1/04

[58] Field of Search .......... 339/17, 75, 74, 99, 97, 339/174, 176, 275, 221, 217; 317/101 CC, 101 CP; 174/DIG. 3

[56] References Cited

UNITED STATES PATENTS

| | | | |
|---|---|---|---|
| 3,624,586 | 11/1971 | Iuacker | 339/17 CF |
| 3,636,497 | 1/1972 | Carter | 339/17 CF |
| 3,649,950 | 3/1972 | Gluntz | 339/17 CF |
| 3,681,743 | 8/1972 | Townsend | 339/17 R X |
| 3,701,075 | 10/1972 | Schullstrom et al. | 339/17 CF |
| 3,701,077 | 10/1972 | Kelly, Jr. | 339/17 CF |

*Primary Examiner*—James T. McCall
*Assistant Examiner*—Terrell P. Lewis
*Attorney, Agent, or Firm*—William Frederick Werner

[57] ABSTRACT

An electronic circuit microelement, seated on the upper surface of a circuit board or chassis, has its terminals projecting upwardly away from said upper surface to a level well above its body. Elongated connectors, one for each terminal, have medial parts anchored in the circuit board, pin-like lower parts projecting beneath the lower surface of the circuit board, and upper parts formed as upstanding S-shaped grooved spring arms that engage the microelement terminals in a plane spaced above the microelement body so that the connectors can be soldered to the terminals by immersion.

5 Claims, 7 Drawing Figures

ELECTRONIC MICROELEMENT ASSEMBLY

STATEMENT OF INVENTION

This invention relates to an assembly for an electronic device comprising a so-called micro-module or integrated circuit microelement, and the invention is concerned more particularly with means for supporting an electronic circuit microelement and for making electrical connections with its terminals.

PRIOR ART

Micromodules or microelements are miniaturized solid state electronic components that can perform various subfuntions in an electronic system or circuit, such as amplification, integration and the like. An individual micromodule can be very small in size but can nevertheless perform operations that previously required a more bulky and complex combination of individual vacuum tubes or transistors with other electronic components.

Because of its small size, the micromodule presents a problem with respect to establishing electrical connections between its several terminals and other components with which it cooperates. In particular, a micromodule can be easily damaged by exposure to temperatures on the order of those employed in making ordinary solder joints, and therefore certain soldering techniques cannot be used in making connections to the terminals of a micromodule. One approach to the solution of this problem is to avoid making soldered connections directly to the micro-module terminals. U.S. Pat. No. 3,311,790, for example, discloses an assembly in which connector elements in the nature of leaf springs are engaged under bias with the micromodule terminals.

However, solder connections are obviously more satisfactory than mere pressure contacts, and the most satisfactory and economical way to make solder connections is by the dipping or immersion technique, whereby a number of connections can be directly immersed in molten solder simultaneously. U.S. Pat. No. 3,701,075 granted Oct. 24, 1972 discloses a construction lending itself to the immersion technique. The present invention is an improvement over that patent and U.S. Pat. Nos. 3,311,790 and U.S. Pat. No. 3,701,077.

OBJECTS OF THE INVENTION

With the foregoing in mind it is a general object of this invention to provide an assembly comprising a micromodule, a circuit board or chassis that can serve as a holder for the micromodule, and a plurality of connectors, each of which provides for making a connection between a terminal of the micromodule and another conductor, which assembly, enables electrical connections to the micromodule terminals to be made by the spring connection method or by immersion or wave soldering without likelihood of damage to the micromodule, and employs the connectors to secure the micromodule to the circuit board or chassis.

It is also an object of this invention to provide an assembly of the character described wherein the connectors are so shaped and arranged as to enable immersion soldering of other conductors to them, should this be desired, and also to enable a plug-in connection to be made between the microelement assembly and another component should such a connection be preferred.

A further object of the present invention is to provide a better electrical contact between the microelement assembly and another component by having the microelement wipe the surface of the companion component free of electrical contamination upon mating.

A still further object of the present invention is to provide a better electrical contact between the microelement assembly and another component by providing a microelement lead structure with a greater electrical contact surface for the same size lead employed in prior structures.

Other objects of the present invention will be pointed out in part and become apparent in part in the following specification and claims.

BRIEF DESCRIPTION OF THE DRAWINGS

Referring to the drawings in which similar characters of reference indicate corresponding parts.

DETAILED DESCRIPTION OF THE INVENTION

Figures 1, 3:
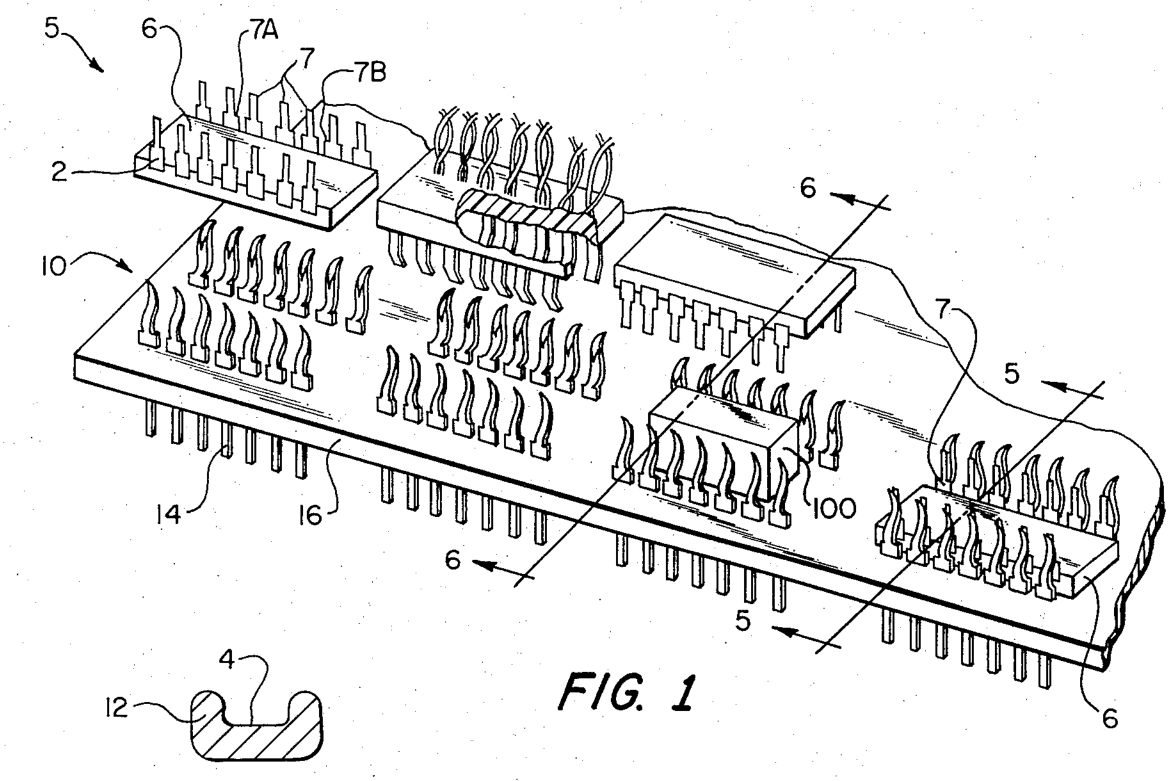
FIG. 1 is a perspective view showing a number of microelement assemblies of this invention with a circuit board, but with the microelement removed from all but one of the assemblies.
FIG. 3 is a horizontal crosssectional view taken on line 3—3 of FIG. 2.
Figure 4:
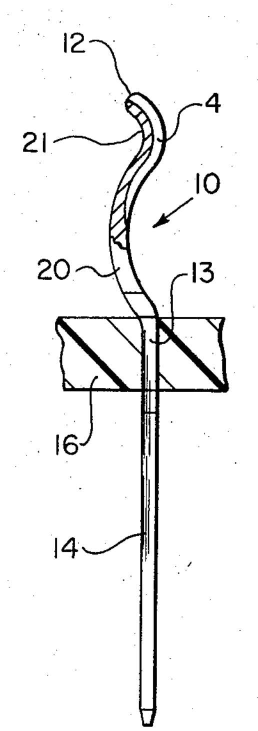
FIG. 4 is a view partly in end elevation and partly in cross section; similar to FIG. 2.
Figure 2:
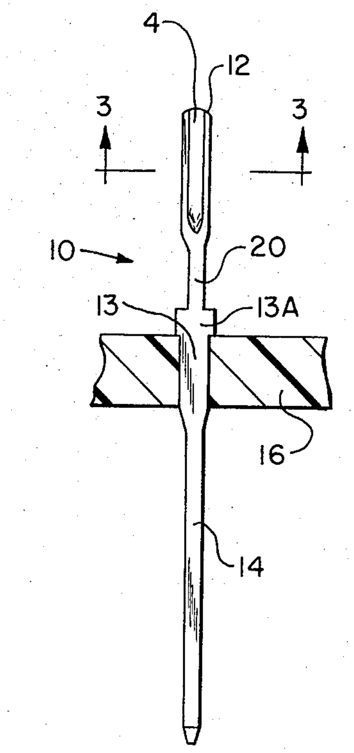
FIG. 2 is a view partly in front elevation and partly in section of a connector embodying the principles of this invention.

Referring now to the accompanying drawings, the numeral 5, designates generally a micromodule or microelement comprising a body 6 and a plurality of terminals 7 that project from opposite parallel sides of the body 6 to provide for connection of the microelement 5 with other components of an electronic device. Each terminal 7 has a slender outer portion or tongue projecting from a wider portion or base 2 fastened in said body. The drawings illustrate, one of the conventional forms of terminal wherein, the junction of the tongue with the base defines a pair of shoulders 7A, 7B which face in the direction of the tongue. However, the present invention is intended to accommodate any shaped terminal having a slender outer portion or tongue, with or without shoulders at the base juncture so that, it is the bending of the tongue 7 by the recepticle end 12, and the resulting frictional contact which confines the tongue 7 in groove 4, as will presently appear.

The assembly also comprises a plurality of female connectors, generally designated by the numeral 10, one for each of the terminals 7 of the microelement 5. The connector 10, although preferably formed in one piece, can be regarded as integrally comprising four parts, namely, a recepticle end 12 that is adapted to have a solder connection to terminal 7 or a spring grip connection to terminal 7, a shoulder section 13A, a medial or anchoring part 13 that is secured in a circuit board or chassis 16, and a contact part 14 which provides for a plug or wrap around wire connection. The anchoring part 13 and contact part 14 of the connector 10 can comprise a straight pin, as shown, and the recepticle end 12 is flattened, widened and bent to a form described hereinafter.

Because the anchoring parts 13 of the several connectors 10 are anchored in the circuit board 16, as by press fits, and the recepticle ends 12 are adapted to have soldered connections with their respective terminals 7, the connectors 10 serve to secure the microelements 5 to the circuit board 16. The shoulder 13A is a gage to correctly position recepticle end 12 in relation to circuit board 16 for reception of a terminal 7.

The contact part 14 of each connector 10 preferably comprises a straight continuation of its anchoring part 13 and extends straight down from the bottom surface of the circuit board 16, so that the several contact parts 14 are parallel to one another and are adapted to provide the male elements or prongs of a plug and socket connection. Alternatively, of course, conductors (not shown) can be attached to the several contact parts 14, and since the zones of attachment of such conductors to the contact parts can be coplanar, such connections can be readily soldered by immersion.

The microelement assembly 5 can be accommodated on circuit board or chassis 16 that also supports other similar assemblies. The arrangement of such assemblies in parallel relationship to form squares or rectangles may be advantageous where many connections between a group of microelements 5 must be made.

The circuit board 16 can obviously be of insulating material, and etched or printed conductors and suitable receptacles for the contact parts 14 can be applied to it in accordance with well-known practice.

The connectors 10 are so arranged on the circuit board 16 that certain of them have their recepticle ends 12 in opposing relationship, spaced to opposite sides of a zone occupied by the body 6 of the microelement 5. Recepticle ends 12 at each side of the body 6 are of course spaced apart laterally by distances corresponding to the spacing of the terminals 7 that they engage.

Each recepticle end 12 comprises a flattened spring, provided with a groove 4, that is bent along its length in a reverse curve or a slightly S-shape so as to have a lower concave portion 20 which is bowed away from the body or anchoring part 13, and well spaced from the terminal 7 in assembled position. An oppositely bowed convexed upper portion 21, is provided, that crosses the plane of its mating upstanding terminal 7. Each recepticle end 12 is grooved by a lengthwise extending groove 4 in which the tongue portion of the terminal 7 is received with a resilient spring grip. The recepticle ends 12 are sinuously curved to have a zone of contact with terminals 7 which each engages. As terminals 7 enter, respective, grooves 4 they provide a wiping action which removes electrical contamination, thus providing good permanent mechanical and electrical connection. It will be observed that the groove 4 surrounds terminal 7 to provide a greater area of electrical contact, than disclosed in prior art structures. Fragile terminals 7 are also supported on three sides in groove 4.

The lower portions 20 of the recepticle ends 12 are spaced to opposite sides of the microelement body 6, but the curvature of the recepticle ends 20 are such that the upper portions 21 of opposing ones may be spaced apart by a distance slightly less than the width of the microelement body 6. However, the recepticle ends 12 flexingly yield as the microelement body 6 is moved downward between them. The curvature of the upper portions 21 of the recepticle ends 12 allows them to be cammed apart by the microelement 5 as it is thus moved downward (see FIGS. 5 and 7).

Attention is directed to the fact that the recepticle ends 12 of the connectors 10 have a length substantially greater than the thickness of the microelement body 6, so that the ends 12 project a substantial distance above said body 6 when the same is seated on the circuit board or chassis 16. (see dead bug position, FIG. 5).

It is also noteworthy that the zones of engagement of the several microelement terminals 7 with the recepticle ends 12 are located substantially in a common plane, which plane is parallel to the upper surface of the circuit board 16 and is spaced a substantial distance above the microelement body 6. By reason of this last described relationship the connections between the terminals 7 and the recepticle ends 12 can be soldered by direct immersion without danger of heat damage to the microelement.

Figure 5:
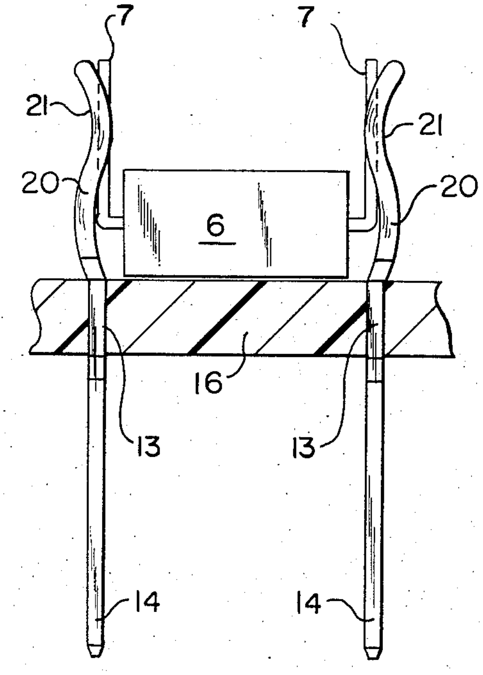
FIG. 5 is a vertical cross sectional view showing the microelement assembled in "dead Bug" position, on line 5—5 of FIG. 1.
Figure 6:
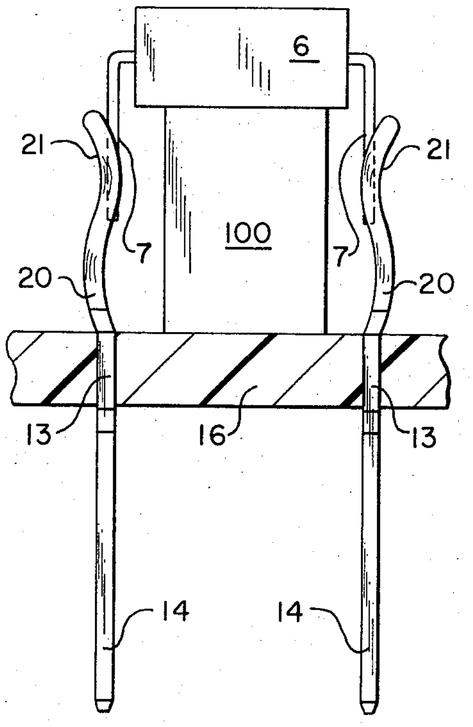
FIG. 6 is a vertical cross sectional view showing the microelement assembled in "live bug" position, with an intermediate spacer block, on line 6—6 of FIG. 1.
Figure 7:
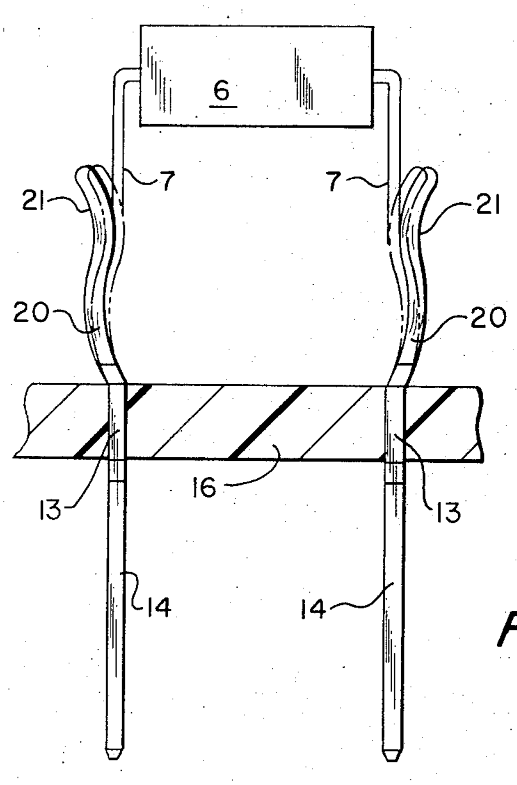
FIG. 7 is a view, similar to FIG. 6, with the spacer block removed, showing the wiping action of the terminals on the recepticle ends of the connectors.

The art recognizes the expression "dead bug," as being one position of orientation between the microelement 5 and the recepticles 12, as illustrated in FIG. 5; and "live bug" position, as illustrated in FIGS. 6 and 7.

In "dead bug" position the microelement 5 rests upon circuit board 16, to position terminals 7 in relation to recepticle ends 12.

In "live bug" position the microelement 5 is remote from circuit board 16 so that the terminals 7 engage recepticle ends 12 by a degree of manual pressure. To insure uniformity between terminals 7 of microelements 5 and recepticle ends 12 attached to circuit board 16, a spacer or gage 100 may be interposed between circuit board 16 and microelement 5, as illustrated in FIG. 6. Gage 100 may be fabricated from electrically neutral plastic material.

From the foregoing description taken with the accompanying drawings it will be apparent that this invention provides an assembly comprising an integrated circuit microelement or micromodule, a circuit board, and simple connectors that secure the microelement to the circuit board and provide for a plug-in or soldered connection between the microelement terminals and other conductors, which assembly permits the connectors to be secured to the microelement terminals by immersion soldering without danger of heat damage to the microelement.

Having shown and described a preferred embodiment of the present invention by way of example, it should be realized that structural changes could be made and other examples given without departing from either the spirit or scope of this invention.

What I claim is:

1. An electronic microelement assembly comprising an electronic microelement having a body with two opposite parallel sides, a plurality of terminals extending from one of said parallel sides, an equal number of a plurality of terminals extending from the other of said two parallel sides, the terminals on one side being aligned with the terminals in the opposite parallel side to form pairs of terminals, all of said terminals projecting in one direction and each of said terminals having a tongue profecting from a base, a circuit board having an upper surface which said microelement body overlies, a bottom surface, and a plurality of connectors carried by the circuit board in insulated relation to one another, said connectors arranged in two parallel rows with the connectors in one row aligned with the connectors in the other of said two parallel rows to form pairs of connectors, said assembly being characterized by each of said connectors:

A. having an anchoring part anchored in the circuit board;
B. having a receptacle end that projects generally upward from said upper surface and which
   1. is grooved to define a slot which has substantially constant width along its length and having a back and two opposite sides, and in which the outer portion of a terminal is closely received by said back and two opposite sides;
   2. has its groove sinuously curved so that the tongue is housed in said groove; and
C. each of said connectors having a contact part which projects from said bottom surface of said circuit board for connection with other conductors,
D. in assembled relation, said pairs of terminals engaging said pairs of connectors to resiliently urge said pairs of connectors away from each other.

2. An electronic microelement assembly comprising an electronic microelement having a body with two opposite parallel sides, a plurality of terminals extending from one of said parallel sides, an equal number of a plurality of terminals extending from the other of said two parallel sides, the terminals on one side being aligned with the terminals in the opposite parallel side to form pairs of terminals, all of said terminals projecting in one direction and each of said terminals having a tongue projecting from a base, a circuit board having an upper surface which said microelement body overlies, a bottom surface, and a plurality of connectors carried by the circuit board in insulated relation to one another, said connectors arranged in two parallel rows with the connectors in one row aligned with the connectors in the other of said two parallel rows to form pairs of connectors, said assembly being characterized by each of said connectors:

A. having an anchoring part anchored in the circuit board;
B. having a receptacle end that projects generally upward from said upper surface and which
   1. is grooved to define a slot which has substantially constant width along its length and having a back and two opposite sides, and in which the outer portion of a terminal is closely received by said back and two opposite sides;
   2. has its groove sinuosly curved so that the tongue is housed in said groove; and
C. each of said connectors having a contact part which projects from said bottom surface of said circuit board for connection with other conductors,
D. in assembled relation, said pairs of terminals engaging said pairs of connectors to resiliently urge said pairs of connectors away from each other,
E. the anchoring part of each connector having a shoulder for engagement with said upper surface.

3. The structure of claim 1 wherein each of said connectors has its receptacle end sinuously curved, further characterized by:

1. the portion of the groove that is nearer said upper surface being curved in the direction to have its (convex) concaved surface facing generally toward the microelement;
2. the portion of the groove that is remote from said upper surface being curved in the opposite direction to have a zone of contact with a terminal tongue near the outer end thereof; and
3. the curvatures of all of the grooves being substantially uniform so that their zones of contact with the terminal tongues lie substantially in a common plane to facilitate immersion soldering of the terminals to the connectors.

4. Means providing for the connection of conductors with an electric circuit microelement of the type that comprises a body having terminals at spaced intervals along opposite sides, arranged in pairs, all of which terminals project in the same direction and each of which terminals has a slender tongue outer portion and an inner base portion, adjacent to the body, said means comprising:

A. a circuit board having an upper surface portion which can be overlain by a microelement;
B. a plurality of connectors, arranged in pairs, one for each terminal on a microelement, each anchored to the circuit board and having a contact part projecting from a bottom surface portion of the circuit board for connection of a wrap around wire connection thereto, each of said connectors having another part which
   1. extends generally normal to upper surface of the circuit board to form a receptacle end, which
   2. is grooved, said groove being of substantially constant width along its length and having a back and two opposite sides, and in which the slender tongue outer portion of a terminal is closely received by said back and two opposite sides, and
   3. said receptacle end being sinuously curved with a lower concave portion and an oppositely bowed convexed upper portion the lower concave portion of the groove that is nearer said upper surface facing generally toward the microelement, the convexed upper portion of the groove being curved to provide a zone of contact with the terminal tongue, the curvatures of the grooves being substantially uniform so that their zones of contact with the terminal tongues lie substantially in a common plane to facilitate immersion soldering of the terminals to connectors;
   4. in assembled relation, said pairs of terminals engaging said pairs of connectors to resiliently urge said pairs of connectors away from each other, whereby said terminal tongues wipe said zones of contact free of electrical contamination, and
   5. the remote curve yieldingly engaging said terminal tongue to force said microelement in a direction toward said upper surface portion upon insertion of said microelement.

5. The apparatus described in claim 4, being provided with a gage interposed between said upper surface and said body to regulate the depth of penetration of said tongue with said groove.

* * * * *